United States Patent
Harrison

(10) Patent No.: US 12,268,094 B2
(45) Date of Patent: Apr. 1, 2025

(54) PIEZOELECTRIC POWER CONVERTER WITH TRAJECTORY CONTROL

(71) Applicant: Enphase Energy, Inc., Petaluma, CA (US)

(72) Inventor: Michael J. Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 275 days.

(21) Appl. No.: 18/093,020

(22) Filed: Jan. 4, 2023

(65) Prior Publication Data

US 2023/0217829 A1    Jul. 6, 2023

Related U.S. Application Data

(60) Provisional application No. 63/296,323, filed on Jan. 4, 2022.

(51) Int. Cl.
| | | |
|---|---|---|
| *H10N 30/40* | (2023.01) | |
| *H02M 1/00* | (2006.01) | |
| *H02M 5/12* | (2006.01) | |
| *H10N 30/80* | (2023.01) | |

(52) U.S. Cl.
CPC .......... *H10N 30/40* (2023.02); *H02M 1/0009* (2021.05); *H02M 1/007* (2021.05); *H02M 5/12* (2013.01); *H10N 30/804* (2023.02)

(58) Field of Classification Search
CPC ... H10N 30/40; H10N 30/804; H02M 1/0009; H02M 1/007; H02M 5/12
See application file for complete search history.

(56) References Cited

U.S. PATENT DOCUMENTS

| | | | |
|---|---|---|---|
| 5,872,419 A † | 2/1999 | Hall | |
| 2010/0188011 A1* | 7/2010 | Kosaka | H05B 41/2827 363/124 |
| 2011/0211380 A1* | 9/2011 | Brown | H02M 3/33561 363/131 |

(Continued)

FOREIGN PATENT DOCUMENTS

| KR | 10-2010-0119567 A | 11/2010 |
|---|---|---|
| KR | 1020160100563 | † 8/2016 |

OTHER PUBLICATIONS

PCT International Search Report and Written Opinion for Application No. PCT/US2023/010082 dated May 9, 2023, 9 pgs.

*Primary Examiner* — Kyle J Moody
(74) *Attorney, Agent, or Firm* — MOSER TABOA

(57) ABSTRACT

A method and apparatus for converting power comprising an input bridge having an input adapted for coupling to a DC source, a piezoelectric transformer having an input coupled to an output of the input bridge, and an output bridge having an input coupled to an output of the piezoelectric transformer and an output adapted to couple to a load. A trajectory controller, coupled to the input bridge and output bridge, (1) measures current and voltage in the input bridge, the output bridge or both, (2) measures a current into or out of the piezoelectric transformer, (3) determines switch timing for control signals for the input bridge and output bridge based upon the measured current and/or voltage, and (4) applies the control signals to the input bridge and output bridge.

14 Claims, 2 Drawing Sheets

(56) References Cited

U.S. PATENT DOCUMENTS

| | | | |
|---|---|---|---|
| 2012/0081934 A1* | 4/2012 | Garrity | H02M 7/46 |
| | | | 363/37 |
| 2014/0268897 A1† | 9/2014 | Zimmanck | |
| 2016/0066464 A1† | 3/2016 | Fornage | |
| 2017/0012556 A1 | 1/2017 | Jeong et al. | |
| 2017/0093164 A1 | 3/2017 | Garrity et al. | |
| 2020/0412165 A1 | 12/2020 | Dent | |

\* cited by examiner
† cited by third party

PIEZOELECTRIC POWER CONVERTER WITH TRAJECTORY CONTROL

RELATED APPLICATION

This application claims benefit to U.S. Provisional Patent Application Ser. No. 63/296,323, filed 4 Jan. 2022 and entitled "Piezoelectric Power Converter With Trajectory Control," which is hereby incorporated herein in its entirety by reference.

BACKGROUND

Field

Embodiments of the present invention generally relate to power conversion and, in particular, to a piezoelectric power converter with trajectory control.

Description of the Related Art

Most power converters use a magnetic transformer to increase or decrease the voltage of the power being converted. A typical power converter, such as a DC-AC inverter, comprises an input bridge, a magnetic transformer, and an output bridge. A controller controls the switching of power transistors within the bridges. A DC voltage is coupled to the input from, for example, at least one solar panel. The input bridge controls the power applied to a primary winding of the magnetic transformer. The transformer steps up the input voltage and the output bridge controls application of the output power to at least one load, e.g., an appliance(s) or the power grid. Such circuits are also used as switching power supplies in other applications. A magnetic transformer-based power converter can attain very high-power conversion efficiency, e.g., about 80 to 90 percent.

In an attempt to shrink the size and weight of power converters, there has been research performed to replace the magnetic transformer with a piezoelectric transformer. A piezoelectric transformer operates by converting the input power into a physical change in the piezoelectric material, i.e., the physical size of the material expands and contracts. These physical changes are transferred from one portion of the material to another portion such that the changes are amplified. An electrode captures the amplified voltage such that a step-up transformer is created without the use of a magnetic transformer. However, piezoelectric transformer-based power converters have been found to be very inefficient, e.g., a power conversion efficiency on the order of 30%.

Therefore, there is a need for piezoelectric power converter with improved power conversion efficiency.

BRIEF DESCRIPTION OF THE DRAWINGS

So that the manner in which the above recited features of the present invention can be understood in detail, a particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention comprise a piezoelectric power converter having trajectory control to improve power conversion efficiency of the power converter. The piezoelectric power converter comprises an input bridge, a piezoelectric transformer and output bridge, where the input bridge and output bridge are controlled by a trajectory controller. The trajectory controller receives and analyzes signals sampled from the input and output bridges, e.g., voltage and/or current, as well as current flowing in or out of the piezoelectric transformer. From the signals, the trajectory controller controls switches (e.g., power transistors) within the bridges to optimally transfer power form the input to output.

Figure 1:
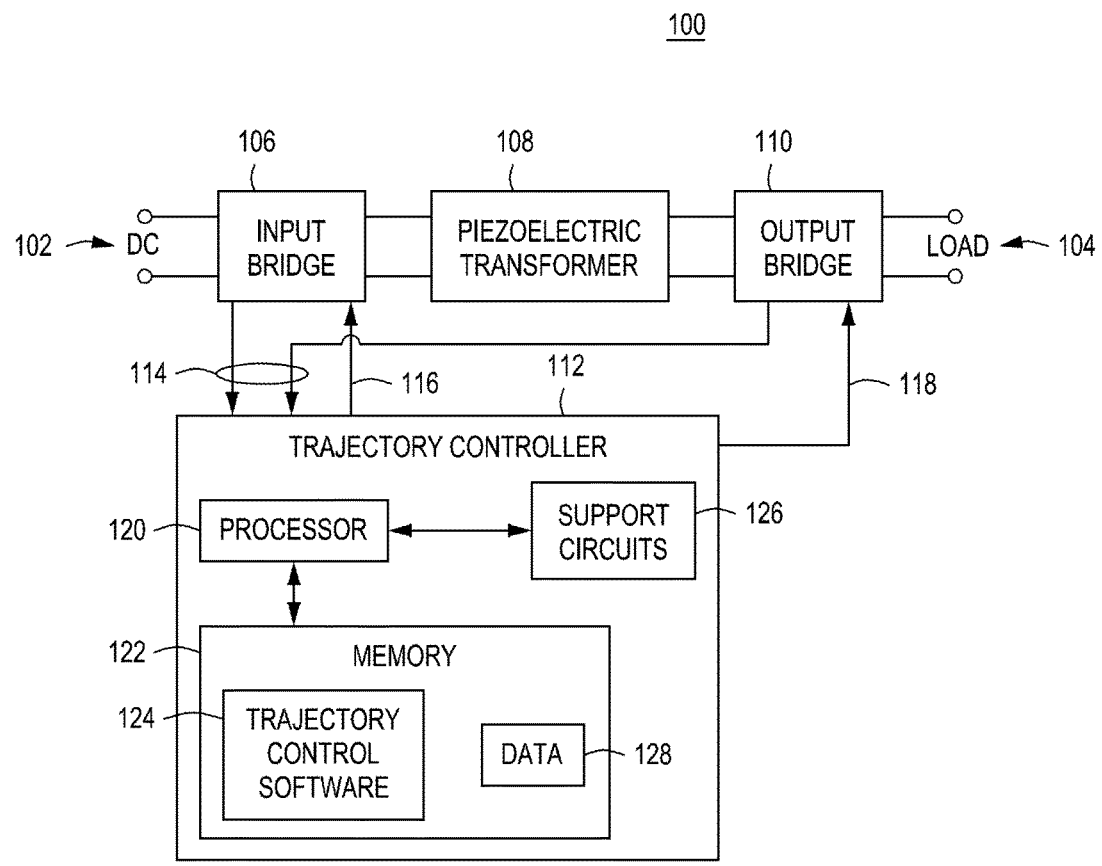
FIG. 1 depicts a block diagram of a piezoelectric power converter in accordance with at least one embodiment of the invention.

FIG. 1 depicts a block diagram of a piezoelectric power converter 100 in accordance with at least one embodiment of the invention. The power converter 100 converts a DC input 102 to an AC output 104. The power converter 100 comprises an input bridge 106, a piezoelectric transformer 108, an output bridge 110, and a trajectory controller 112. The input and output bridges 106 and 110 may comprise half-bridges or full-bridges having a plurality of switches (e.g., power transistors) that are controlled by the trajectory controller 110. The input bridge 106 converts the DC input into a high-frequency AC signal that forms the input to the piezoelectric transformer 108.

The input and output bridges 106 and 110 respectively supply the trajectory controller 110 current and voltage samples along paths 114. In one embodiment, the samples include voltages from one or more of the bridges and either an input or output current sample of the piezoelectric transformer 108. The trajectory controller 110 couples switching signals along paths 116 and 118 to the input and output bridges 106 and 110. The process by which the current and voltage samples are used to control the bridges 106 and 110 is described in detail with respect to FIG. 3 below.

The piezoelectric transformer 108 mechanically vibrates in response to the input AC signal. In one embodiment, the "primary" half of the transformer 108 is a multilayer piezoelectric structure. Such a multilayer ceramic structure provides higher voltage gains (e.g., 20 to 70) as compared to a single layer structure. In some embodiments, the ceramic material used is, for example, lead titanate or lead zirconate. The AC signal is applied the primary structure via a pair of electrodes. The secondary structure is generally a single layer of ceramic material that is physically coupled to the primary structure. As the AC signal causes the primary structure to vibrate, the vibrations are coupled to the secondary structure that create a voltage on an output electrode. The amplitude of the output voltage is increased as compared to the amplitude of the input voltage. The gain is typically 20 to 70, i.e., the output voltage is 20 to 70 times larger than the input voltage.

The trajectory controller 110 comprises at least one processor 120, at least one memory 122 and support circuits 126. The at least one processor 120 may be any form of processor or combination of processors including, but not limited to, central processing units, microprocessors, microcontrollers, field programmable gate arrays, graphics processing units, application specific integrated circuits, and the like. The support circuits 126 may comprise well-known circuits and devices facilitating functionality of the processor(s). The support circuits 126 may comprise one or more of, or a combination of, power supplies, clock circuits, communications circuits, cache, input/output (I/O) circuits, and/or the like.

The memory 122 comprises one or more forms of non-transitory computer readable media including one or more of, or any combination of, read-only memory or random-access memory. The memory 122 stores software and data including, for example, trajectory control software 124. The trajectory control software 124 utilizes data 128 (e.g., current and/or voltage samples) to control the switching process of the input and output bridges 106 and 110 as described in detail below with respect to FIG. 3.

Figure 2:
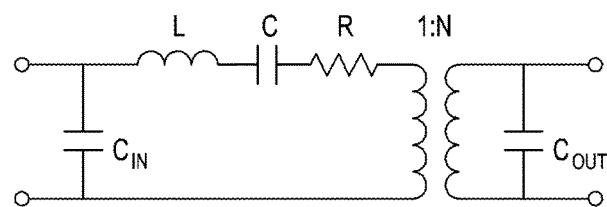
FIG. 2 depicts an equivalent circuit model for a piezoelectric transformer.

FIG. 2 depicts an electrical circuit model 200 of the piezoelectric transformer 108 in FIG. 1. Such an electrical circuit model 200 describes the behavior of a longitudinal-mode piezoelectric transformer operating near its fundamental resonant frequency. The multi-layer input structure forms a large input capacitance $C_{IN}$ that is dependent upon the length, width, thickness and number of layers that form the primary end of the transformer. The output capacitance $C_{OUT}$ is very small and insignificant in comparison to the input capacitance $C_{IN}$. The mechanical piezoelectric gain near the resonant frequency is modeled by L, C, and R in FIG. 2.

The model 200 in FIG. 2 is electrically equivalent to a resonant magnetic circuit as is used in conventional resonant power converters. As such, using a piezoelectric transformer in a power converter, causes the converter to function as a resonant converter. Consequently, as with resonant magnetic power converters, using an optimal switching technique such as trajectory control in a piezoelectric-based power converter substantially increases the energy conversion efficiency.

To improve the energy transfer through the piezoelectric transformer and improve the overall efficiency of the power converter, the bridge circuits are switched using trajectory control. Trajectory control facilitates efficient energy transfer from the input bridge to the piezoelectric transformer and then from the piezoelectric transformer through the output bridge to the output terminals. Such power conversion enables a low voltage DC input to be converted to a high-voltage AC waveform, e.g., about 17 volts DC (VDC) converted to about 240 volts AC (VAC) at 60 Hz. Such a circuit is useful in DC-AC inverters used as microinverters of a solar power generation system, where the piezoelectric power converter is configured to be coupled between at least one solar panel and at least one load. Using trajectory control raises the conversion efficiency to at least 80%.

Figure 3:
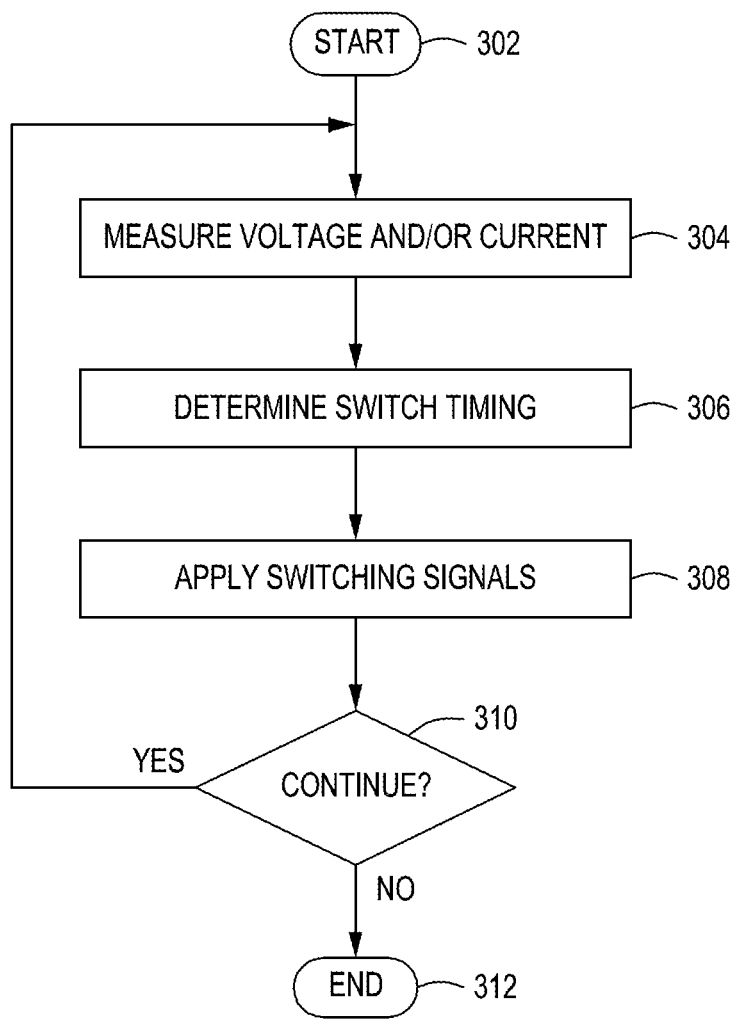
FIG. 3 depicts a flow diagram of operation of the piezoelectric power converter of FIG. 1 in accordance with at least one embodiment of the invention.

FIG. 3 depicts a flow diagram of a method 300 of operation of the trajectory controller 110 of FIG. 1 in accordance with at least one embodiment of the invention. The method 300 begins at 302 and proceeds to 304 where voltages and currents are measured within the input and/or output bridges. In at least one embodiment, the voltage across the input and output bridges and the current at either the input or output of the piezoelectric transformer are measured (e.g., two voltages and one current). In other embodiments, other current and voltages may be used to control switching of the bridges. Based on the current and voltage levels, a state machine determines the switch timing for both the input and output bridges.

At 308, the switch timing is applied to the input and output bridge switches. In at least one embodiment, the switching control signals facilitate the use of three operational phases or states. In one embodiment, the three phases include: (1) a first phase where energy is transferred from the input bridge of the converter into the piezoelectric transformer, (2) a second phase effectively disconnects the piezoelectric transformer from the input and output bridges and allows the self-resonance of the piezoelectric transformer to become correctly phased to allow for an efficient transfer of the stored energy to the output bridge, and a third phase where the piezoelectric transformer is connected to the output bridge enabling an efficient transfer of energy based on correctly loading the piezoelectric transformer. After this third phase, there is a return to the second phase to allow the piezoelectric transformer to self-resonate and become phased correctly to facilitate an efficient power transfer from the input bridge and into the piezoelectric transformer.

At 310, the method 300 queries whether the method 300 should continue. If the query is affirmatively answered, the method 300 returns to 304 to perform another switching sequence. In one embodiment, the switching sequence repeats the states with each pass through the method 300, e.g., operational phases 1, 2, 3, 2, 1, 2, 3, 2, 1 . . . , with the duration in each phase controlled by the current and voltage analysis. The duration (frequency) of activation of each operational phase adjusts as converter load and environmental changes occur such that the operational phase control frequency varies with resonant frequency changes of the piezoelectric transformer. If the query at 310 is negatively answered, the method 300 ends at 312.

Here multiple examples have been given to illustrate various features and are not intended to be so limiting. Any one or more of the features may not be limited to the particular examples presented herein, regardless of any order, combination, or connections described. In fact, it should be understood that any combination of the features and/or elements described by way of example above are contemplated, including any variation or modification which is not enumerated, but capable of achieving the same. Unless otherwise stated, any one or more of the features may be combined in any order.

As above, figures are presented herein for illustrative purposes and are not meant to impose any structural limitations, unless otherwise specified. Various modifications to any of the structures shown in the figures are contemplated to be within the scope of the invention presented herein. The invention is not intended to be limited to any scope of claim language.

Where "coupling" or "connection" is used, unless otherwise specified, no limitation is implied that the coupling or connection be restricted to a physical coupling or connection and, instead, should be read to include communicative couplings, including wireless transmissions and protocols.

Any block, step, module, or otherwise described herein may represent one or more instructions which can be stored on a non-transitory computer readable media as software and/or performed by hardware. Any such block, module, step, or otherwise can be performed by various software and/or hardware combinations in a manner which may be automated, including the use of specialized hardware designed to achieve such a purpose. As above, any number of blocks, steps, or modules may be performed in any order or not at all, including substantially simultaneously, i.e., within tolerances of the systems executing the block, step, or module.

Where conditional language is used, including, but not limited to, "can," "could," "may" or "might," it should be understood that the associated features or elements are not required. As such, where conditional language is used, the elements and/or features should be understood as being optionally present in at least some examples, and not necessarily conditioned upon anything, unless otherwise specified.

Where lists are enumerated in the alternative or conjunctive (e.g., one or more of A, B, and/or C), unless stated otherwise, it is understood to include one or more of each element, including any one or more combinations of any number of the enumerated elements (e.g. A, AB, AB, ABC, ABB, etc.). When "and/or" is used, it should be understood that the elements may be joined in the alternative or conjunctive.

While the foregoing is directed to embodiments of the present invention, other and further embodiments of the invention may be devised without departing from the basic scope thereof, and the scope thereof is determined by the claims that follow.

The invention claimed is:

1. Apparatus for converting power comprising:
   an input bridge having an input adapted for coupling to a DC source;
   a piezoelectric transformer having an input coupled to an output of the input bridge;
   an output bridge having an input coupled to an output of the piezoelectric transformer and an output adapted to couple to a load; and
   a trajectory controller that (1) measures current or voltage in the input bridge, the output bridge or both, (2) measures a current into or out of the piezoelectric transformer, (3) determines switch timing for control signals for the input bridge and output bridge based on the measured current and/or voltage, and (4) applies the control signals to the input bridge and output bridge,
   wherein the trajectory controller controls the input bridge to apply voltage to the input of the piezoelectric transformer and controls the output bridge to receive voltage from the output of the piezoelectric transformer, and
   wherein the switch timing uses a switching sequence having the following states: (1) enable the input bridge to apply input voltage to the piezoelectric transformer input, (2) disconnect both input and output bridges from the piezoelectric transformer, (3) enable the output bridge to receive voltage from the piezoelectric transformer output, and return to state (2).

2. The apparatus of claim 1, wherein, during state (2), the piezoelectric transformer self resonates.

3. The apparatus of claim 1, wherein the trajectory controller measures the voltage across the input bridge, the voltage across the output bridge and the current flowing in to or out of the piezoelectric transformer.

4. The apparatus of claim 1, wherein the apparatus has a conversion efficiency of at least 80 percent.

5. The apparatus of claim 1, wherein the DC source supplies about 17 VDC and the output bridge generates about 240 VAC.

6. A method for trajectory controlling a power converter, where the power converter comprises an input bridge having an input adapted for coupling to a DC source; a piezoelectric transformer having an input coupled to an output of the input bridge; an output bridge having an input coupled to an output of the piezoelectric transformer and an output adapted to couple to a load; and a trajectory controller that performs a method comprising:
   measuring current or voltage in the input bridge, the output bridge or both;
   measuring a current into or out of the piezoelectric transformer;
   determining switch timing for control signals for the input bridge and output bridge based upon the measured voltage and/or current;
   applying the control signals to the input bridge and output bridge;
   controlling the input bridge to apply voltage to the input of the piezoelectric transformer and controlling the output bridge to receive voltage from the output of the piezoelectric transformer,
   wherein the switch timing uses a switching sequence having the following states: (1) enable the input bridge to apply input voltage to the piezoelectric transformer input, (2) disconnect both input and output bridges from the piezoelectric transformer, (3) enable the output bridge to receive voltage from the piezoelectric transformer output, and return to state (2).

7. The method of claim 6, wherein, during state (2), the piezoelectric transformer self resonates.

8. The method of claim 6, further comprising measuring the voltage across the input bridge, the voltage across the output bridge and the current flowing in to or out of the piezoelectric transformer.

9. The method of claim 6, wherein the method causes the power converter to have a conversion efficiency of at least 80%.

10. The method of claim 6, wherein the DC source supplies about 17 VDC and the output bridge generates about 240 VAC.

11. A power converter configured to be coupled between a DC source and a load comprising:
    an input bridge having an input adapted for coupling to the DC source;
    a piezoelectric transformer having an input coupled to an output of the input bridge;
    an output bridge having an input coupled to an output of the piezoelectric transformer and an output coupled to the load; and
    a trajectory controller that (1) measures current or voltage in the input bridge, the output bridge or both, (2) measures a current into or out of the piezoelectric transformer, (3) determines switch timing for control signals for the input bridge and output bridge based on the measured current and/or voltage, and (4) applies the control signals to the input bridge and output bridge,
    wherein the trajectory controller controls the input bridge to apply voltage to the input of the piezoelectric transformer and controls the output bridge to receive voltage from the output of the piezoelectric transformer, and
    wherein the switch timing uses a switching sequence having the following states: (1) enable the input bridge to apply input voltage to the piezoelectric transformer input, (2) disconnect both input and output bridges from the piezoelectric transformer, (3) enable the output bridge to receive voltage from the piezoelectric transformer output, and return to state (2).

12. The power converter of claim 11, wherein, during state (2), the piezoelectric transformer self resonates.

13. The power converter of claim 11, wherein the trajectory controller measures the voltage across the input bridge, the voltage across the output bridge and the current flowing in to or out of the piezoelectric transformer.

14. The power converter of claim 11, wherein the DC source is at least one solar panel.

* * * * *